(12) United States Patent
Fumitake

(10) Patent No.: US 8,716,080 B2
(45) Date of Patent: May 6, 2014

(54) SEMICONDUCTOR DEVICE MANUFACTURING METHOD

(75) Inventor: Mieno Fumitake, Beijing (CN)

(73) Assignee: Semiconductor Manufacturing International (Beijing) Corporation (CN)

( * ) Notice: Subject to any disclaimer, the term of this patent is extended or adjusted under 35 U.S.C. 154(b) by 0 days.

(21) Appl. No.: 13/481,803

(22) Filed: May 26, 2012

(65) Prior Publication Data

US 2013/0119478 A1 May 16, 2013

(30) Foreign Application Priority Data

Nov. 10, 2011 (CN) .......................... 2011 1 0354553

(51) Int. Cl.
*H01L 21/8238* (2006.01)
*H01L 29/78* (2006.01)

(52) U.S. Cl.
CPC . *H01L 21/823807* (2013.01); *H01L 21/823842* (2013.01); *H01L 21/823814* (2013.01); *H01L 29/7843* (2013.01); *H01L 29/7833* (2013.01)
USPC .......................................... 438/199; 257/369

(58) Field of Classification Search
CPC ............... H01L 21/823807; H01L 21/823842; H01L 21/823814; H01L 29/7843; H01L 29/7833
USPC .......................................... 257/369; 438/199
See application file for complete search history.

(56) References Cited

U.S. PATENT DOCUMENTS

| 2007/0004117 A1* | 1/2007 | Yagishita ....................... 438/197 |
| 2008/0224258 A1* | 9/2008 | Schepis et al. ................ 257/522 |
| 2009/0124097 A1* | 5/2009 | Cheng ........................... 438/792 |
| 2011/0147811 A1* | 6/2011 | Kavalieros et al. ........... 257/288 |

* cited by examiner

*Primary Examiner* — Anthony Ho
(74) *Attorney, Agent, or Firm* — Innovation Counsel LLP

(57) ABSTRACT

A semiconductor device is described as including a first fin having a layer formed of a first semiconductor material and a second fin that is formed of a second semiconductor material. The first and second semiconductor materials are different. The second semiconductor material may have a mobility of P-type carriers that is greater than a mobility of P-type carriers of the first semiconductor material. The second fin includes a layer formed of the first semiconductor material below the layer formed of the second semiconductor material. The semiconductor device further includes a hard mask layer disposed on the first and second fins and an insulator layer disposed below the first and second fins. The first and second semiconductor materials include silicon and germanium, respectively. The first and second fins are used to form respective N-channel and a P-channel semiconductor devices.

18 Claims, 5 Drawing Sheets

100

SEMICONDUCTOR DEVICE MANUFACTURING METHOD

CROSS-REFERENCE TO RELATED APPLICATIONS

This application claims priority to Chinese Patent Application No. 201110354553.3, filed on Nov. 10, 2011 and entitled "Semiconductor Device and Manufacturing Method Thereof", which is incorporated herein by reference in its entirety. This application is related to commonly owned patent application number (to be provided), entitled "Semiconductor Device and Manufacturing Method Thereof", filed concurrently herewith, the entire content of which is herein incorporated by reference.

FIELD OF THE INVENTION

The present invention relates to the field of semiconductor manufacturing techniques, and more specifically, to semiconductor devices and manufacturing methods thereof.

BACKGROUND OF THE INVENTION

Description of the Related Art

With the continuous development of semiconductor manufacturing techniques, critical dimensions of devices continue to shrink. With the ongoing trend in decreasing device dimensions, fin-structured semiconductor devices have been proposed, such as fin field effect transistors (FinFETs). Presently, FinFETs have been widely used in the fields of memory and logical devices.

In "Challenges and Solutions of FinFET Integration in an SRAM Cell and a Logic Circuit for 22 nm node and beyond", H. Kawasaki, et al, IEDM 2009, pages 289-292, a FinFET technology suitable for even smaller nodes has been introduced. In that publication, the fin of a semiconductor device is fabricated through a sidewall image transfer (SIT) process.

However, such FinFET technique encounters a problem of discreteness (variation) of channel widths of devices. On the other hand, if the height of the fin is large, a larger space can be preserved for the gate. However, with the continuous decrease in fin dimensions (particularly, thickness or width), it become an important issue that fin may collapse and be unexpectedly removed in semiconductor device fabrication.

Therefore, there is a need to mitigate or eliminate the above problems. In view of the above-described problems of the prior art techniques, a novel semiconductor device and manufacturing method thereof have been proposed.

SUMMARY OF THE INVENTION

The inventor has noticed that the increasingly aggressive requirements for fin dimensions will be moderated if carrier mobility in a device is improved.

Embodiments of the present invention improve carrier mobility in a fin-structured semiconductor device, so as to relax the device size requirements.

An embodiment of the present invention provide a semiconductor device that includes a first fin formed of a first semiconductor material, and a second fin comprising a layer formed of a second semiconductor material, wherein the first semiconductor material is different from the second semiconductor material.

In one embodiment, the second fin further comprises a layer formed of the first semiconductor material below the layer formed of the second semiconductor material. The first semiconductor material may include silicon (Si), and the second semiconductor material may include germanium (Ge). In one embodiment, the first fin may be used to form an N channel semiconductor device, and the second fin may be used to form a P channel semiconductor device.

In one embodiment, the semiconductor device further comprises a hard mask layer located on the first and second fins.

In one embodiment, the semiconductor device further comprises an insulator layer below the first and second fins. In one embodiment, the second semiconductor material has a P-type carrier mobility of greater than the P-type carrier mobility of the first semiconductor material.

In one embodiment, the semiconductor device further comprises gate insulating layers and gates for the N channel semiconductor device and for the P channel semiconductor device. In one embodiment, the gate for the N channel semiconductor device and the gate for the P channel semiconductor device are formed of metals having respective appropriate work functions.

According to another embodiment of the present invention, a method of manufacturing a semiconductor device includes providing a first substrate having a first semiconductor layer and a first hard mask layer on the first semiconductor layer. The first semiconductor layer includes a first region and a second region, the first region is formed of a first semiconductor material, and the second region includes a layer formed of a second semiconductor material that is different from the first semiconductor material. The method further includes forming a second mask layer having a first pattern and a second pattern on the first hard mask layer, such that the first pattern is located on the first hard mask over the first region and the second pattern is located on the first hard mask over the second region, and etching the first hard mask layer and the first semiconductor layer using the second mask layer as a mask to form a first fin in the first region and a second fin in the second region, such that the first fin comprises a layer formed of the first semiconductor material, and the second fin comprises a layer formed of the second semiconductor material.

In one embodiment, the second semiconductor material has a P-type carrier mobility greater than the P-type carrier mobility of the first semiconductor material.

In one embodiment, the first fin is adaptable for forming an N channel semiconductor device, while the second fin is adaptable for forming a P channel semiconductor device.

In one embodiment, the forming of the second mask layer includes forming a mandrel layer on the first hard mask layer, the mandrel layer contains an opening having two sidewalks, with a first sidewall being located at the first region and a second sidewall being located at the second region. The forming of the second mask layer also includes forming a first spacer on the first sidewall and a second spacer on the second sidewall of the opening, the first and second spacers may act as a first pattern and a second pattern. The method also includes removing the mandrel layer after the formation of the spacers.

In one embodiment, the method further comprises removing the second mask layer. In another embodiment, the method further comprises removing the hard mask layer.

In one embodiment, the first semiconductor material comprises silicon (Si), and the second semiconductor material comprises germanium (Ge).

In one embodiment, the providing a first substrate includes providing a second substrate, the second substrate comprising a second semiconductor layer (e.g., a silicon layer). The providing a first substrate further includes selectively forming a SiGe layer in the silicon layer, and performing oxidation such that silicon in the SiGe layer is oxidized, and at least a portion of germanium in the SiGe layer is separated out of the SiGe layer so as to form a germanium layer.

In one embodiment, the oxidation is performed in an atmosphere of oxygen at a standard atmospheric pressure (atm) and a temperature of 650° C.

In one embodiment, the method further comprises performing annealing or oxidation for the formed SiGe layer.

In one embodiment, the first substrate further comprises an insulator layer below the first semiconductor layer.

In one embodiment, the forming of the SiGe layer may include forming a sacrificial blocking layer on the silicon layer, forming an opening through the sacrificial blocking layer extending into the silicon layer and selectively growing silicon-germanium (SiGe) in the opening. Thereafter, the sacrificial blocking layer can be removed.

In one embodiment, the opening is formed in the silicon layer such that a silicon layer having 5 atom-layers or less is remained below a bottom surface of the opening.

In one embodiment, the oxidation is performed such that the silicon in the SiGe layer and the upper portion of the silicon layer are oxidized and a oxide layer is thus formed. The first semiconductor layer is formed of the Ge layer and a portion of the silicon layer that is not oxidized by the oxidation.

In one embodiment, the oxide layer is the first, hard mask layer.

In one embodiment, the method further includes removing the oxide layer to expose the first semiconductor layer, and forming the first hard mask layer on the first semiconductor layer.

In one embodiment, the method further includes forming gate insulating layers and gates for an N channel semiconductor device and for a P channel semiconductor device. In one embodiment, the gate for the N channel semiconductor device and the gate for the P channel semiconductor device are formed of metals having respective appropriate work functions.

Although the present invention is particularly useful in advanced semiconductor device fabrication techniques (for example, memory devices, logic devices, and the like), the present invention is not limited thereto. In practice, the present invention has a wide range of applications.

Further benefits, advantages, and features of the present invention will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate exemplary embodiments of the invention and, together with the description, serve to explain the principles of the invention. The present invention can be more clearly understood by reading the following detailed description with reference to the accompanying drawings, in which.

DESCRIPTION OF THE EMBODIMENTS

Figure 1:
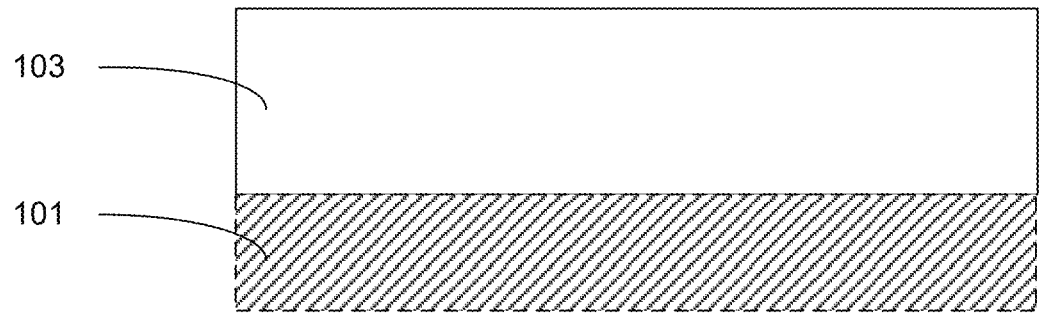
FIG. 1 shows a schematic cross-sectional diagram of a substrate according to an embodiment of the present invention.

It should be understood that the drawings are merely illustrative in nature and are not intended to limit the scope of the present invention. In the drawings, various components are not necessarily drawn to scale or according to their actual shapes, and some of the components (e.g., layers or parts) may be enlarged relative to others so as to more clearly explain the principles of the present invention. For simplicity and clarity, details of well-known features and techniques are not shown in the drawings to avoid unnecessarily obscuring the present invention. FIG. 1 to FIG. 8A-B show a series of schematic cross-sectional diagrams illustrating progressive stages in fabricating a semiconductor device according to embodiments of the present invention.

FIG. 1 illustrates a simplified schematic cross-sectional diagram of a substrate 100 according to an embodiment of the present invention. As shown, substrate 100 comprises a semiconductor layer 103. The semiconductor layer 103 can be formed of a first semiconductor material that can be, for example, silicon (Si).

In a preferred embodiment, the substrate 100 is a Semiconductor on Insulator (SOI) substrate. In such a case, the substrate 100 may further comprise an insulator layer 101 below the semiconductor layer 103, and the substrate 100 may comprise an additional semiconductor layer (not shown) below the insulator layer 101. However, the present invention is not limited thereto.

It should be appreciated that although a SOI substrate is preferable, the present invention is also applicable to monocrystalline silicon substrates, that is, bulk substrates. As those skilled in the art will appreciate, in such a case, there can be no insulator layer below the semiconductor layer. Hence, the insulator layer 101 is shown by dashed lines in the figures.

Figure 2:
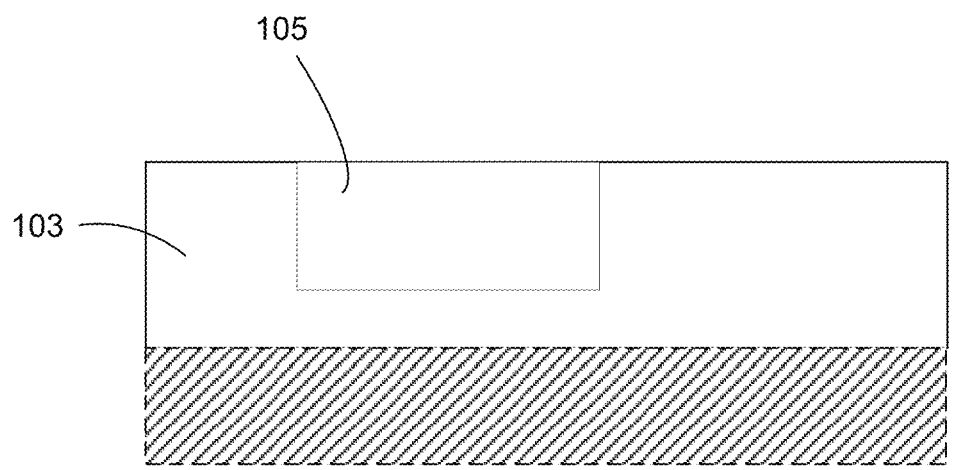
FIG. 2 shows a schematic cross-sectional diagram of a SiGe layer formed in the substrate according to an embodiment of the present invention.

FIG. 2 is a schematic cross-sectional diagram illustrating a SiGe layer formed in the substrate according to an embodiment of the present invention. As shown in FIG. 2, a SiGe layer 105 may be selectively formed in the semiconductor layer 103. In a specific embodiment, a sacrificial blocking layer (not shown) can be formed on the semiconductor layer 103. The sacrificial blocking layer can be an oxide layer (for example, a layer of silicon oxide, but not limited thereto), formed by, for example, thermal oxidation or deposition. Then, an opening can be formed through the sacrificial blocking layer and extending into the initial semiconductor layer 103. Then, a SiGe layer is grown to a sufficient thickness. Herein, as appreciated by those skilled in the art, SiGe can be selectively grown in the opening, because SiGe growth substantially occurs on the exposed surface of silicon and not on the sacrificial blocking layer. Thereafter, the sacrificial blocking layer can be removed, and optionally, the surface of the resulting substrate can be planarized.

It should be understood that the method of selectively forming the SiGe layer 105 is not limited thereto. For example, an opening can be formed in the silicon layer, followed by a growth of a SiGe layer and CMP to obtain the resulting structure as shown in FIG. 2.

In an embodiment, after forming the SiGe layer, an annealing or oxidation process can be performed on the SiGe layer to improve or stabilize the atom disorder of the SiGe layer, and to some extent repair defects or damages. When an oxidation process is performed, oxides formed by the oxidation process can be removed.

Figure 3A:
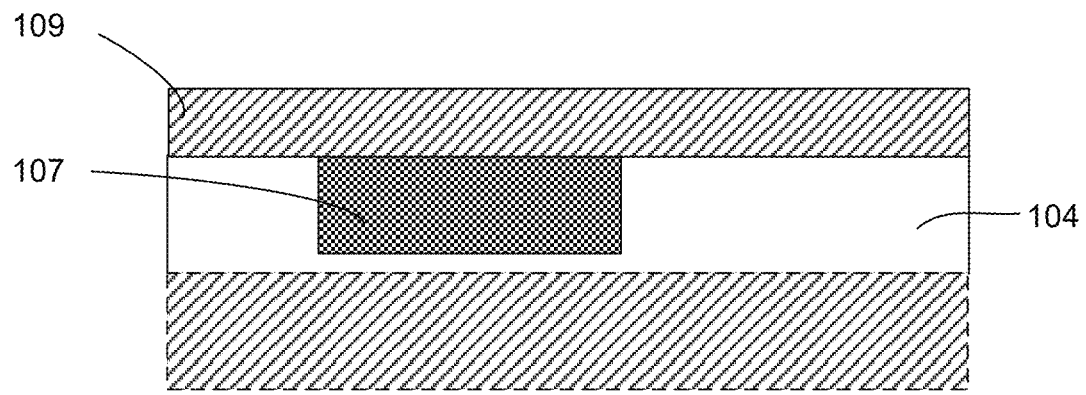
FIGS. 3A and 3B are schematic cross-sectional diagrams of performing oxidation after the step of FIG. 2 to form a Ge layer according to an embodiment of the present invention.
Figure 3B:
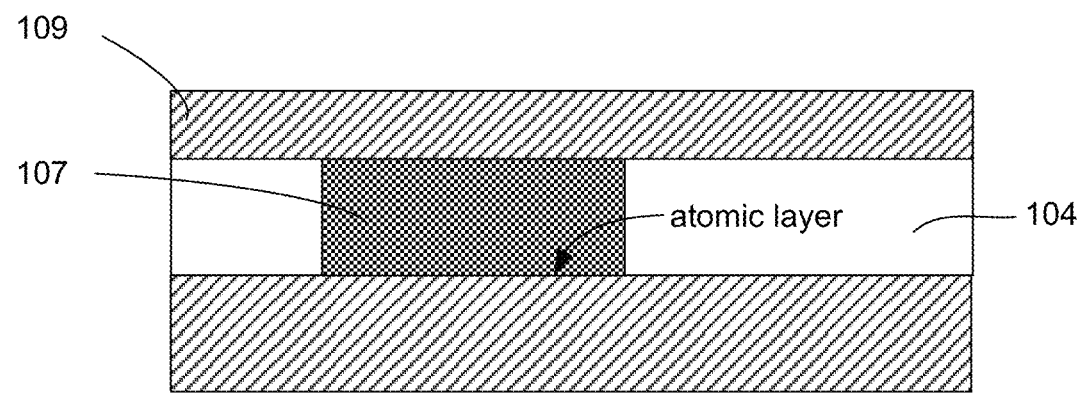

Then, as shown in FIG. 3A or 3B, oxidation is performed such that a germanium (Ge, a second semiconductor material) layer is formed. Herein, the oxidation causes that silicon (Si) in the SiGe layer 105 is oxidized and at least a portion of germanium (Ge) is separated out of the SiGe layer to form a Ge layer 107. In an example embodiment, the oxidization can be carried out in an oxygen atmosphere at the standard atmospheric pressure (atm) and at a temperature of about 650° C.

An upper portion of the semiconductor layer 103 is also oxidized in the oxidization. Thereby, an oxide layer 109 is formed by the oxide formed through the oxidation of the Si in the SiGe layer and the oxide formed through the oxidation of the upper portion of the semiconductor layer. In other words, the oxidation is performed such that the silicon in the SiGe layer and the upper portion of the silicon layer are oxidized and a oxide layer 109 is thus formed. A semiconductor layer (a first semiconductor layer) is formed of the Ge layer and a portion of the semiconductor layer 103 that is not oxidized.

The structure shown in FIG. 3A is also applicable to other similar structures in which a mono-crystalline silicon substrate, that is, a bulk silicon substrate, is employed, where an insulator layer is not necessary or optional. Therefore, the insulator layer is shown by dashed lines in FIG. 3A.

FIG. 3B shows another preferred embodiment of the present invention. As mentioned above, a SOI substrate is preferable in this invention. In an embodiment, in the case where a SOI substrate is used, the opening in the semiconductor layer, i.e., the Si layer 103, in which the SiGe layer 105 is formed, can be formed such that five atom layers or even less of silicon (Si) is remained below the bottom surface of the opening. In other words, the opening is formed such that a silicon layer having 5 atom-layers or less is remained below a bottom surface of the opening. Thus, all the silicon in the SiGe layer 105 can be oxidized, with merely the Ge layer 107 formed from the Ge separated out of the SiGe layer remained. Incidentally, the oxidation can also have an annealing function.

Figure 4:
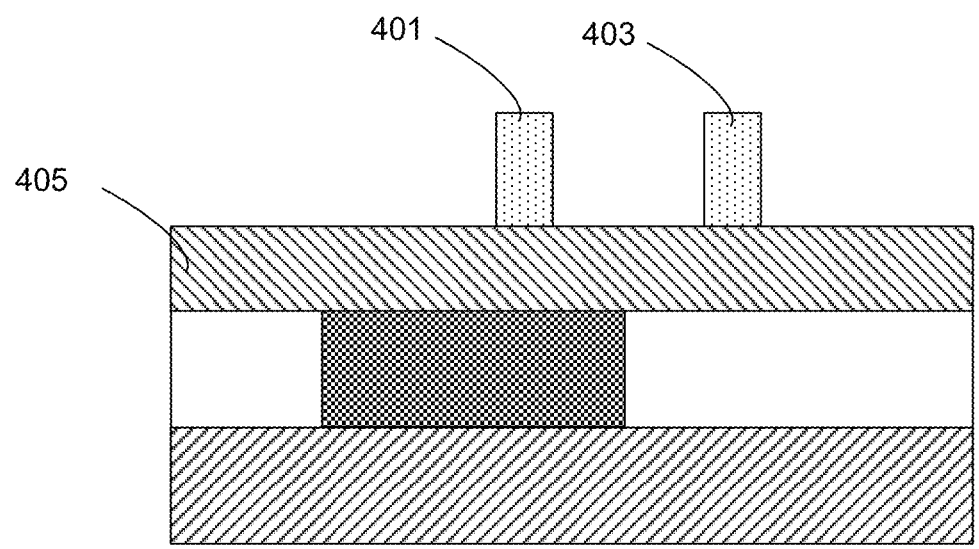
FIG. 4 is a schematic cross-sectional diagram of forming a mask after the oxidation according to embodiments of the present invention.

Herein, in some embodiments, the oxide layer 109 can be used as a hard mask (hard mask 405 as shown in FIG. 4). In other embodiments, the oxide layer 109 can be removed, and a hard mask 405 is additionally formed, which can be formed from, for example, amorphous silicon (α-Si).

As those skilled in the art would appreciate, various methods and alternatives can be used to form the structures shown in FIGS. 3A and 3B, and are not limited to the above disclosure.

It should be understood that Ge employed in this specific embodiment of the present invention is merely an exemplary material for improving carrier mobility in a P-channel device, and the present invention should not be limited thereto. In addition, the present invention is also applicable to cases where other semiconductor materials other than Si are used as a substrate material (for example, corresponding to mono-crystalline semiconductor) or epitaxial material (for example, corresponding to SOI substrate).

Other suitable semiconductor materials can also be used to substitute the Ge in the present invention. In such cases, the second semiconductor material layer can be formed through a method that is known in the art, and therefore, the step of forming the second semiconductor material layer through oxidization may not be required.

Hence, a method of manufacturing a semiconductor device according to an embodiment of the present invention may include providing a first substrate (so termed to distinguish from the substrate 100, which is termed as a second substrate), the first substrate having a first semiconductor layer and a first hard mask layer on the first semiconductor layer, wherein the first semiconductor layer comprises a first region (for example, an region 104 formed of Si laterally adjacent to the Ge layer 107) and a second region (for example, the Ge layer 107), the first region being formed of a first semiconductor material, and the second region comprising a layer formed of a second semiconductor material that is different from the first semiconductor material.

In one embodiment, the second semiconductor material (e.g., Ge) has a mobility of P-type carriers (or, to say, P-type carrier mobility) that is greater than the mobility of P-type carriers (or, P-type carrier mobility) of the first semiconductor material (e.g., Si).

Thereafter, as shown in FIG. 4, a second mask layer is formed on the hard mask 405, the second mask layer having a first pattern or feature 403 and a second pattern or feature 401, and the first pattern being located on the first region, and the second pattern being located on the second region. In one embodiment, the surface area of each of the first and second patterns (upper surface area or lower surface area is smaller than the surface area of the respective first and second regions, so that the surface area (upper surface area or lower surface area) of a fin to be formed is smaller than the surface area of the corresponding first and second regions.

It should be understood that, for some applications under large technology nodes (CD), the mask can be formed using a photo-resist. With the continuously shrinking of technology nodes, it is becoming difficult to achieve small critical dimensions beyond photolithography limits through photolithography. In such a case, patterns 401 and 403 can be formed through sidewall image transfer (SIT), double patterning, SAM (self-assembly) techniques, nano-imprint techniques, or the like.

Figure 5A:
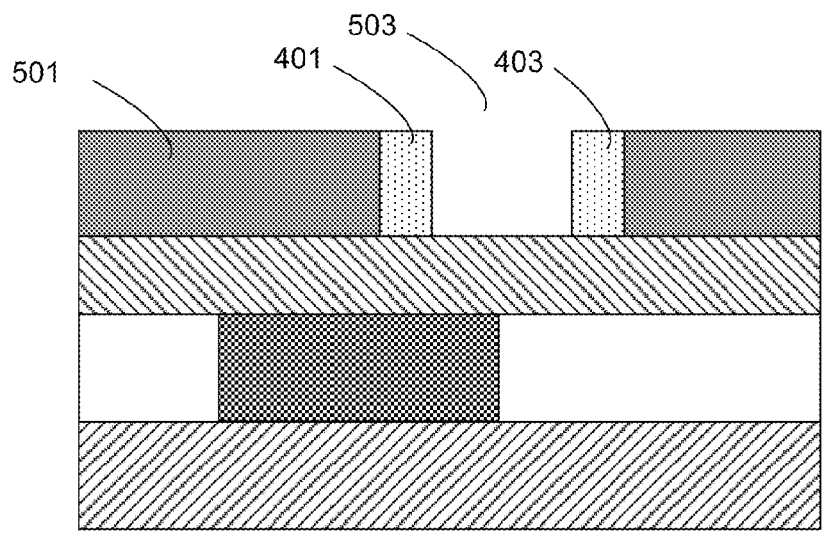
FIGS. 5A-5C are schematic cross-sectional diagrams illustrating steps of forming a mask according to embodiments of the present invention.
Figure 5B:
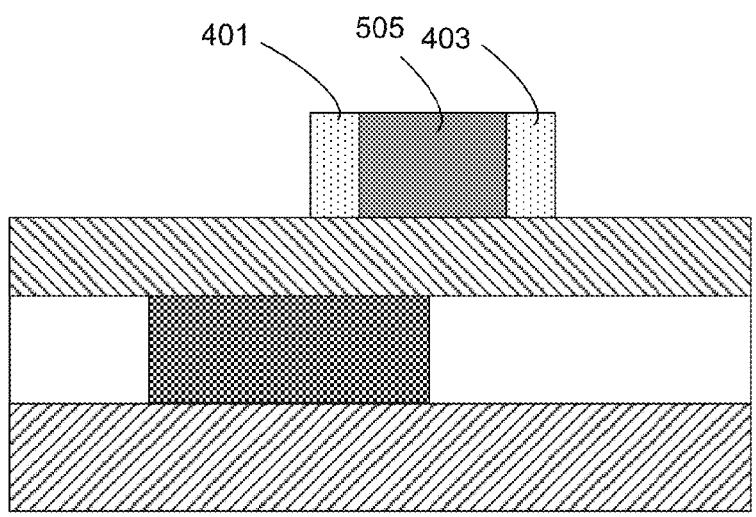
Figure 5C:
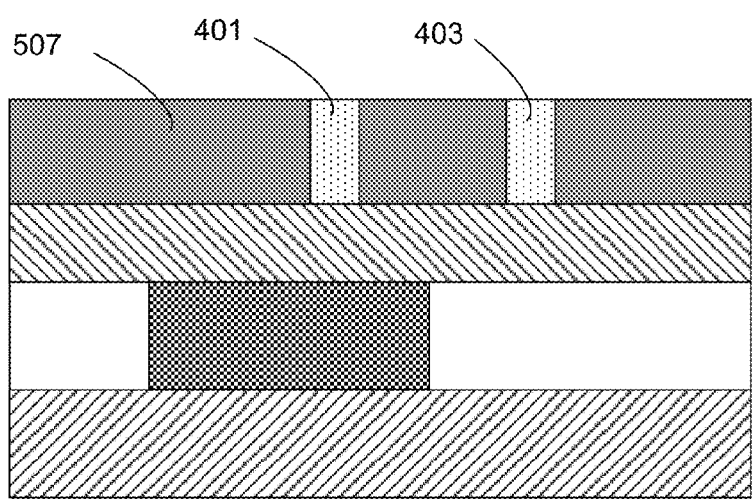

FIGS. 5A-5C are schematic cross-sectional diagrams illustrating processes for forming the second mask layer in a method of manufacturing a semiconductor device according to embodiments of the present invention.

FIG. 5A illustrates a situation in which a second mask layer is formed through a mandrel-spacer method according to an embodiment of the present invention. As shown in FIG. 5A, a mandrel layer 501 can be formed on the hard mask 405. The mandrel layer 501 can be formed of silicon oxide, poly-silicon, or the like. An opening 503 can be formed in the mandrel layer 501. In one embodiment, the opening has a first sidewall that is located over the first region and a second sidewall that is located over the second region of the first semiconductor layer, as shown in FIG. 5A. Then, a first spacer and a second spacer can be formed on the respective sidewalls of the opening, the first and second spacers may act as the first and second patterns, respectively. Then, the mandrel layer 501 can be removed.

FIG. 5B illustrates another process of forming the second mask layer. A sacrificial pattern 505 having sidewalls is formed on the hard mask 405. Then, spacers 401 and 403 (acting as the first and second patterns) are formed on the sidewalls of the sacrificial pattern 505. Then, the sacrificial pattern 505 is removed. FIG. 5B is in a sense similar to FIG. 5A because the sacrificial pattern 505 can be regarded as a kind of mandrel.

FIG. 5C illustrates yet another method of forming the second mask layer, in which a double patterning method is employed in which, for example, patterns 401 and 403 can be formed in a photo-resist 507 through photo-lithographing and being exposed twice. Then, a portion of the photo-resist 507 that is not needed can be removed. In such a case, before etching using the second mask layer, patterns 401 and 403 can be baked to make them resistant to collapsing during the etching process.

Figure 6:
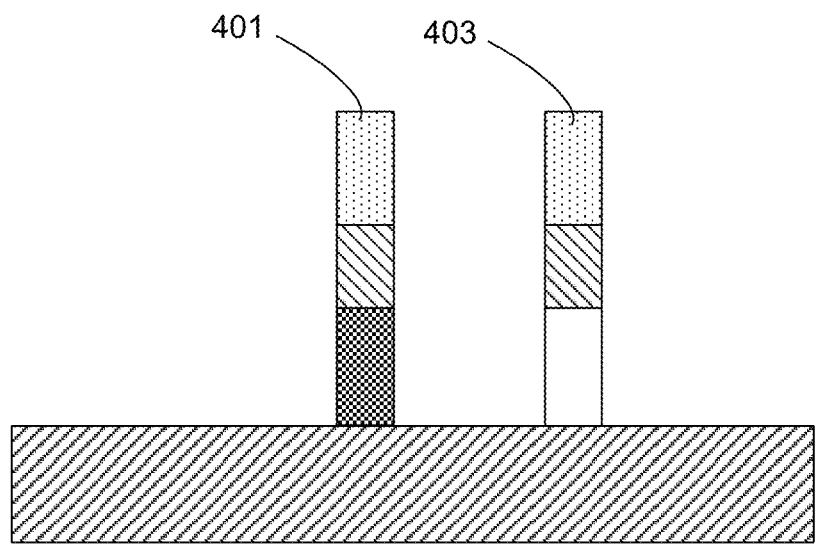
FIG. 6 is a schematic cross-sectional diagram of forming fins through etching after forming the mask of FIGS. 5A through 5C.

After forming the mask patterns 401 and 403, the hard mask and the first semiconductor layer are etched using the mask patterns, so that a second fin comprising a layer formed of the second semiconductor material is formed in the second region, as shown in FIG. 6. In one embodiment, a first fin formed of the first semiconductor material can also be formed in the first region. As appreciated by those skilled in the art, the etching can be preformed in multiple steps, for example, etching the hard mask 405 and then the first semiconductor layer. Alternatively, etching can be performed in a same etching equipment in an all-in-one manner, without removing wafers out of the etching equipment.

In one embodiment, the first fin is adapted to form a N-channel semiconductor device, and the second fin is adapted to form an P-channel semiconductor device.

Figure 7A:
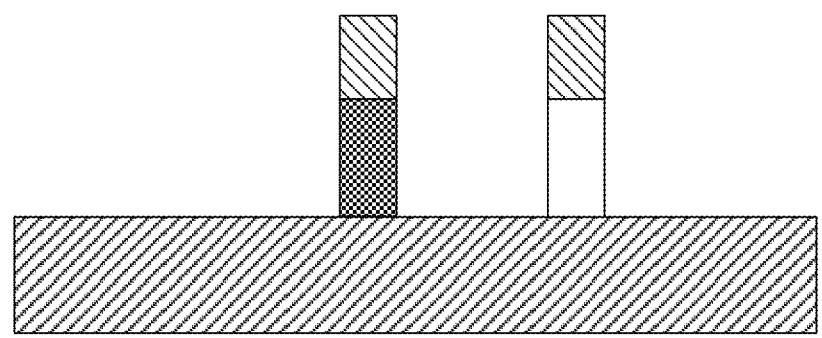
FIGS. 7A and 7B are cross-sectional schematic diagrams of removing the mask and the hard mask after forming the fins of FIG. 6.
Figure 7B:
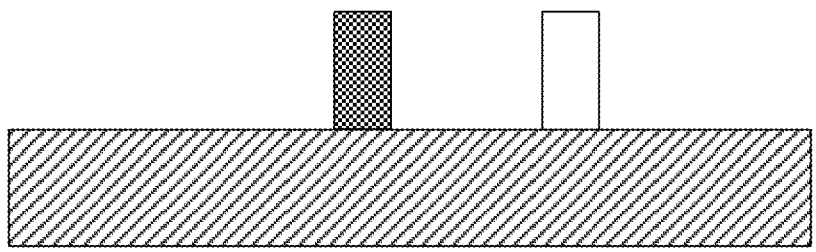

Then, the mask patterns are removed. In some implementations, the hard mask can be remained to protect the fins. In other applications, the hard mask can be removed. FIG. 7A is a schematic diagram illustrating the situation in which the mask patterns are removed while the hard mask is retained. FIG. 7B is a schematic diagram illustrating the situation in which both of the mask patterns and hard mask are removed.

Figure 8A:
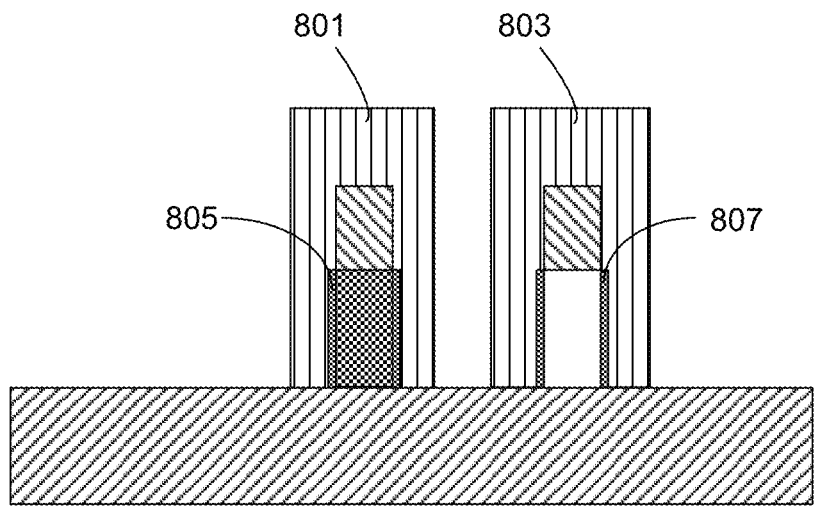
FIGS. 8A and 8B are schematic cross-sectional diagram illustrating steps of forming gate insulating layers and gates after the steps shown in FIGS. 7A and 7B.
Figure 8B:
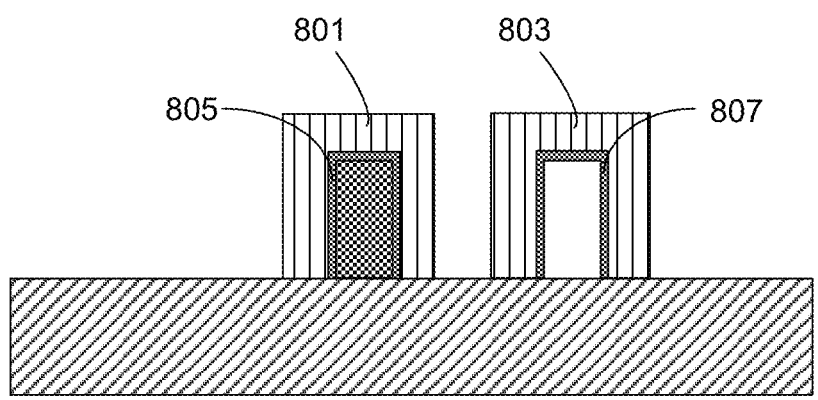

Then, source, drain, gate insulating layer, gate, and the like can be formed according to conventional FinFET fabrication techniques. As shown in FIGS. 8A and 8B, gate insulating layer 805 and gate 801 for a P-channel semiconductor device and gate insulating layer 807 and gate 803 for an N-channel semiconductor device are formed. FIG. 8A illustrates a double-gate fin semiconductor device with the hard mask retained, and FIG. 8B illustrates a triple-gate fin semiconductor device with the hard mask removed. It should be understood that FIGS. 8A and 8B are merely illustrative, and the present invention is not limited thereto. It should be further understood that the method according to the present invention may comprise a step of forming source and drain regions which are not shown in FIGS. 8A and 8B.

Further, In one embodiment, the gates can be formed of work function (WF) metals so as to benefit the adjustment of device threshold. In other words, for the devices with different channel-types, gates formed of metals with different work functions can be provided. For example, work-function metals with appropriate work functions can be used for N-type (N-channel) and P-type (P-channel) devices, respectively. For example, as to P-type device, Os, Pt, Pd, Ir, Au, Pt, Cu and the like can be used; as to N-type device, W, Mo, Cu, Cr, Nb, Ta, Cd, Hf, La, Cs and the like can be used.

Embodiments of the present invention also provide a semiconductor device. The semiconductor device includes a first fin formed of a first semiconductor material; and a second fin comprising a layer formed of a second semiconductor material, wherein the first, semiconductor material is different from the second semiconductor material.

In one embodiment, the second fin further comprises a layer formed of the first semiconductor material below the layer formed of the second semiconductor material.

In one embodiment, the semiconductor device further comprises a hard mask layer located on the first and second fins, respectively.

In one embodiment, the semiconductor device further comprises an insulator layer disposed below the first and second fins.

In one embodiment, the second semiconductor material has a mobility of P-type carriers (P-type carrier mobility) that is greater than the mobility of P-type carriers (P-type carrier mobility) of the first semiconductor material.

In one embodiment, the first semiconductor material comprises silicon (Si), and the second semiconductor material comprises germanium (Ge).

In one embodiment, the first fin is used to form an N channel semiconductor device, and the second fin is used to form a P channel semiconductor device. In another embodiment, the semiconductor device may further include gate insulating layers and gates for the N channel semiconductor device and the P channel semiconductor device. In yet another embodiment, the gate for the N channel semiconductor device and the gate for the P channel semiconductor device are formed of metals having respective appropriate work functions.

According to the present invention, the carrier mobility in P-channel FinFETs can be improved, and thus the requirement on fin dimensions can be relaxed with enhanced yield and lowered costs.

The embodiments of the present invention have been described as above with reference to the drawings. It should be appreciated that, however, these embodiments are merely illustrative in nature but not intended to limit the scopes of the invention. These embodiments can be arbitrarily combined without going beyond the scope of the present invention. In addition, the embodiments and details of the present invention can be modified by those skilled in the art in light of the teachings of the invention, without departing from the scope of the present invention. Therefore, all these modifications are embraced within the spirit and scope of the present invention as defined by the attached claims.

What is claimed is:

1. A method of manufacturing a semiconductor device, the method comprising:
   (a) providing a first substrate having a first semiconductor layer and a first hard mask layer on the first semiconductor layer, wherein the first semiconductor layer comprises a first region and a second region, the first region being formed of a first semiconductor material, the second region comprising a layer that is formed of a second semiconductor material different from the first semiconductor material and is formed when the first hard mask layer is being formed;
   (b) forming a second mask layer having a first pattern and a second pattern on the first hard mask layer, the first pattern being located on the first hard mask over the first region and the second pattern being located on the first hard mask over the second region; and
   (c) etching the first hard mask layer and the first semiconductor layer using the second mask layer as a mask to form a first fin in the first region and a second fin in the second region such that the first fin comprises a layer formed of the first semiconductor material, and the second fin comprises a layer formed of the second semiconductor material.

2. The method according to claim 1, wherein the second semiconductor material bas a P-type carrier mobility greater than a P-type carrier mobility of the first semiconductor material.

3. The method according to claim 2, wherein the first fin is adaptable for forming an N channel semiconductor device, while the second fin is adaptable for forming a P channel semiconductor device.

4. The method according to claim 3, further comprising:
(f) forming gate insulating layers and gates for the N channel semiconductor device and the P channel semiconductor device.

5. The method according to claim 4, wherein the gates for the N channel semiconductor device and for the P channel semiconductor device are formed of metals having respective appropriate work functions.

6. The method according to claim 1, wherein the step (b) of forming the second mask layer comprises:
(b1) forming a mandrel layer on the first hard mask layer, the mandrel layer having an opening formed therein, a first sidewall of the opening being located at the first region and a second sidewall of the opening being located at the second region;
(b2) forming a first spacer on the first sidewall to form a first pattern, and a second spacer on the second sidewall to form a second pattern; and
(b3) removing the mandrel layer.

7. The method according to claim 1 further comprising: removing the second mask layer.

8. The method according to claim 7 further comprising: removing the first hard mask layer.

9. The method according to claim 1 wherein the first semiconductor material comprises silicon (Si), and the second semiconductor material comprises germanium (Ge).

10. The method according to claim 9 wherein the providing of a first substrate comprises:
(a1) providing a second substrate comprising a silicon layer;
(a2) selectively forming a SiGe layer in the silicon layer;
(a3) performing oxidation such that silicon in the SiGe layer is oxidized, and at least a portion of germanium in the SiGe layer is separated out of the SiGe layer to form a germanium layer.

11. The method according to claim 10, wherein the oxidation is performed using oxygen at a standard atmospheric pressure (atm) and a temperature of about 650° C.

12. The method according to claim 10, further comprising: performing annealing or oxidation after forming the SiGe layer.

13. The method according to claim 10, wherein the forming of the SiGe layer comprises:
(a21) forming a sacrificial blocking layer on the silicon layer;
(a22) forming an opening through the sacrificial blocking layer extending into the silicon layer;
(a23) selectively growing silicon-germanium (SiGe) in the opening; and
(a24) removing the sacrificial blocking layer.

14. The method according to claim 13, wherein the opening is formed such that a silicon layer having 5 atom-layers or less is remained below a bottom surface of the opening.

15. The method according to claim 10, wherein the oxidation is performed such that the silicon in the SiGe layer and the upper portion of the silicon layer are oxidized and an oxide layer is thus formed, and the first semiconductor layer is formed of the Ge layer and portion of the silicon layer that is not oxidized by the oxidation.

16. The method according to claim 15 wherein the oxide layer is the first hard mask layer.

17. The method according to claim 15 further comprising:
removing the oxide layer to expose the first semiconductor layer; and
forming the first hard mask layer on the first semiconductor layer.

18. The method according to claim 1, wherein the first substrate further comprises an insulator layer below the first semiconductor layer.

* * * * *